United States Patent
Huang et al.

(10) Patent No.: US 6,760,257 B2
(45) Date of Patent: Jul. 6, 2004

(54) PROGRAMMING A FLASH MEMORY CELL

(75) Inventors: Jen-Ren Huang, Hsinchu (TW);
Ming-Hung Chou, Hsinchu (TW);
Jen-Ren Chiou, Hsinchu (TW)

(73) Assignee: Macronix International Co., Ltd. (TW)

( * ) Notice: Subject to any disclaimer, the term of this patent is extended or adjusted under 35 U.S.C. 154(b) by 33 days.

(21) Appl. No.: 10/230,666

(22) Filed: Aug. 29, 2002

(65) Prior Publication Data

US 2004/0042270 A1 Mar. 4, 2004

(51) Int. Cl.⁷ .................................................. G11C 7/00
(52) U.S. Cl. ........................... 365/185.24; 365/185.18; 365/185.33; 365/185.28; 365/189.01; 365/185.03
(58) Field of Search ....................... 365/185.24, 185.18, 365/185.33, 185.28, 189.01, 185.03

(56) References Cited

U.S. PATENT DOCUMENTS

| | | | | |
|---|---|---|---|---|
| 5,953,255 A | * | 9/1999 | Lee | 365/185.29 |
| 6,226,200 B1 | * | 5/2001 | Eguchi et al. | 365/185.19 |
| 6,307,776 B1 | * | 10/2001 | So et al. | 365/185.03 |
| 6,643,181 B2 | * | 11/2003 | Sofer et al. | 365/185.22 |
| 2002/0021149 A1 | * | 2/2002 | Park et al. | 327/87 |
| 2002/0080649 A1 | * | 6/2002 | Yamada et al. | 365/185.03 |
| 2003/0076710 A1 | * | 4/2003 | Sofer et al. | 365/185.22 |
| 2003/0144053 A1 | * | 7/2003 | Michaelson | 463/25 |

FOREIGN PATENT DOCUMENTS

JP         411317087 A   * 11/1999  ........... G11C/16/02

* cited by examiner

*Primary Examiner*—Viet Q. Nguyen
(74) *Attorney, Agent, or Firm*—Finnegan, Henderson, Farabow, Garrett & Dunner, L.L.P.

(57) ABSTRACT

Programming a flash memory cell comprises receiving a first $V_t$ corresponding to a first bit stored in the flash memory cell and receiving a second $V_t$ corresponding to a second bit stored in the flash memory cell. In additon, programming the flash memory cell comprises programming one of the first bit and the second bit of the flash memory cell with a first programming voltage if the first $V_t$ and the second $V_t$ both correspond to a low $V_t$ state prior to programming the flash memory cell. Furthermore, the first programming voltage is $\Delta V$ lower than a second programming voltage that is used to program one of the first bit and the second bit of the flash memory cell if either of the first $V_t$ and the second $V_t$ correspond to a high $V_t$ state prior to programming the flash memory cell.

26 Claims, 6 Drawing Sheets

PROGRAMMING A FLASH MEMORY CELL

DESCRIPTION OF THE INVENTION

1. Field of the Invention

The invention relates generally to systems and methods for programming a flash memory cell, and more particularly, to systems and methods for programming a flash memory cell wherein the flash memory cell is capable of storing two bits.

2. Background of the Invention

The use of memory products and systems in the day-to-day lives of most people is continually growing. With the advent and steady growth of computer based systems, wireless telecommunications, and the Internet, memory products and systems must increasingly become smaller, faster, and less expensive. In an effort to lower operating costs and increase value for their customers, providers and programmers of memory products and systems wish to program flash memory cells accurately and efficiently, especially those flash memory cells capable of storing two bits. Providers and programmers of memory products and systems may attract new users and customers to their products and systems or may tend to retain current users and customers by providing methods and systems for accurately and efficiently programming flash memory cells. Thus, providers and programmers of memory products and systems may realize a competitive advantage by providing methods and systems for accurately and efficiently programming flash memory cells capable of storing two bits.

Therefore, the need for systems and methods for programming flash memory cells has become a common need for many providers and programmers of memory products and systems. More specifically, methods and systems for accurately and efficiently programming flash memory cells capable of storing two bits has become critical for many providers and programmers of memory products and systems. This is because in an increasingly competitive environment, meeting and exceeding the expectations of customers or others who receive products or services is essential for flash memory products and systems providers.

One solution to the flash memory cell programming problem for flash memory cells capable of storing two bits is to simply program one bit in the flash memory cell to a particular programming voltage level, for example, a high $V_t$ state, without regard for the present programming state of the other bit within flash memory cell. Great inefficiencies are created in this procedure because, for example, if programming a second bit to a high $V_t$ state when a first bit is in a high $V_t$ state, the $V_t$ value of the first bit will become higher after the second bit is programmed. FIG. 5 illustrates the problem with this conventional solution. A graph 505 illustrates the average high $V_t$ levels of the two bits programmed for a plurality of memory cells in a memory array, the x axis being the number of memory cells cycling in the array and the y axis being the $V_t$ level. Curve 510 illustrates the average $V_t$ of a first bit programmed in time in a two-bit memory cell, curve 515 illustrates the average $V_t$ of a second bit programmed in time in a two-bit memory cell, and curve 520 illustrates the average $V_t$ of the first bit programmed in time after the second bit is programmed. As can be see from FIG. 5, programming the second bit to a high $V_t$ level causes an increase of the high $V_t$ of the first bit previously programmed to the same high $V_t$ level.

The disadvantages of the conventional method are illustrated in FIG. 6A and FIG. 6B. FIG. 6A illustrates a probabilistic distribution 605 of the $V_t$ of a plurality of first bits programmed in time in a given memory array. FIG. 6B illustrates the probabilistic distribution 610 of the $V_t$ of a plurality of second bits programmed in time in a given memory array and the probabilistic distribution 615 of the $V_t$ of the plurality of the first bits programmed in time after the second bit is programmed. As shown by FIG. 6B, one disadvantage is that the probabilistic distribution of the first bits will become wider and higher after programming the second bits. And as a second disadvantage, because the $V_t$ of the first bit becomes higher, more area must be erased in order to balance the second bit effect. Therefore, it may be over-erased due to the highest $V_t$ in one memory cell. Accordingly, efficiently providing systems and methods for programming flash memory cells wherein the flash memory cells are capable of storing two bits remains an elusive goal.

Thus, there remains a need for systems and methods for programming flash memory cells. In addition, there remains a need for systems and methods for programming flash memory cells wherein the flash memory cells are capable of storing two bits each.

SUMMARY OF THE INVENTION

Consistent with the present invention, methods and systems for programming a flash memory cell are provided that avoid problems associated with prior methods and systems for programming a flash memory cell as discussed herein above.

In one aspect, a method for programming a flash memory cell comprises receiving a first $V_t$ corresponding to a first bit stored in the flash memory cell, receiving a second $V_t$ corresponding to a second bit stored in the flash memory cell, and programming one of the first bit and the second bit of the flash memory cell with a first programming voltage if the first $V_t$ and the second $V_t$ both correspond to a low $V_t$ state prior to programming the flash memory cell wherein the first programming voltage is $\Delta V$ lower than a second programming voltage that is used to program one of the first bit and the second bit of the flash memory cell if either of the first $V_t$ and the second $V_t$ correspond to a high $V_t$ state prior to programming the flash memory cell.

In another aspect, a system for programming a flash memory cell comprises a component for receiving a first $V_t$ corresponding to a first bit stored in the flash memory cell, a component for receiving a second $V_t$ corresponding to a second bit stored in the flash memory cell, and a component for programming one of the first bit and the second bit of the flash memory cell with a first programming voltage if the first $V_t$ and the second $V_t$ both correspond to a low $V_t$ state prior to programming the flash memory cell wherein the first programming voltage is $\Delta V$ lower than a second programming voltage that is used to program one of the first bit and the second bit of the flash memory cell if either of the first $V_t$ and the second $V_t$ correspond to a high $V_t$ state prior to programming the flash memory cell.

In yet another aspect, a computer-readable medium on which is stored a set of instructions for programming a flash memory cell, which when executed perform stages comprising receiving a first $V_t$ corresponding to a first bit stored in the flash memory cell, receiving a second $V_t$ corresponding to a second bit stored in the flash memory cell, and programming one of the first bit and the second bit of the flash memory cell with a first programming voltage if the first $V_t$ and the second $V_t$ both correspond to a low $V_t$ state prior to programming the flash memory cell wherein the first programming voltage is $\Delta V$ lower than a second programming voltage that is used to program one of the first bit and the second bit of the flash memory cell if either of the first $V_t$ and the second $V_t$ correspond to a high $V_t$ state prior to programming the flash memory cell.

Both the foregoing general description and the following detailed description are exemplary and are intended to provide further explanation of the invention as claimed.

BRIEF DESCRIPTION OF THE DRAWINGS

The accompanying drawings provide a further understanding of the invention and, together with the detailed description, explain the principles of the invention. In the drawings.

DESCRIPTION OF THE EMBODIMENTS

Figure 1A:
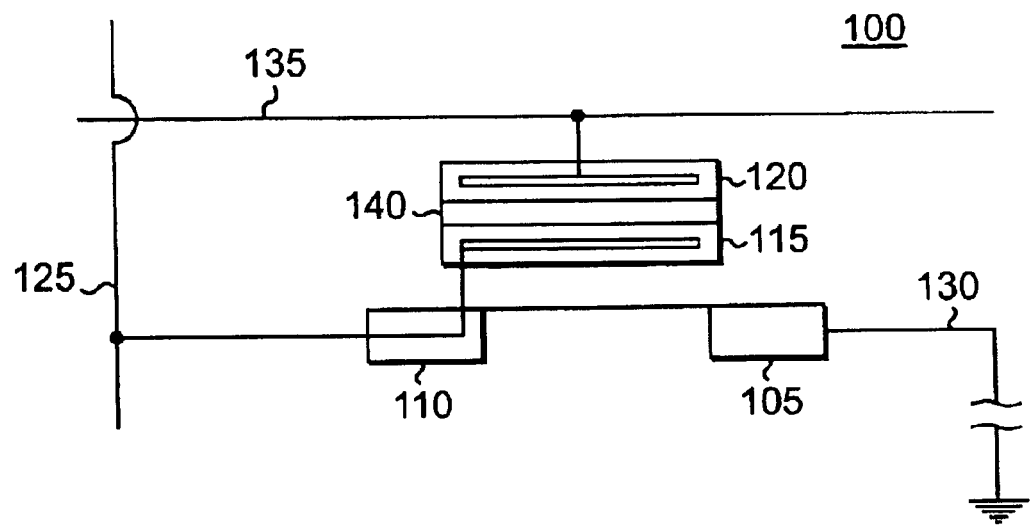
FIG. 1A is a functional block diagram of an exemplary flash memory cell for sorting one bit per cell.

Reference will now be made to various embodiments according to this invention, examples of which are shown in the accompanying drawings and will be obvious from the description of the invention. In the drawings, the same reference numbers represent the same or similar elements in the different drawings whenever possible.

In a conventional split gate flash memory or Electrically Erasable Programmable Read-Only-Memory ("EEPROM"), commonly known as a non-volatile memory, programming may be achieved by storing electrons in the floating gate of the memory cell. Under certain bias conditions, electrons in a semiconductor substrate can tunnel through a thin oxide layer disposed between the floating gate and the semiconductor substrate to allow for charge storage in the floating gate. The tunneling electrons may be created by a conventional hot-electron injection scheme or a Fowler-Nordheim tunneling scheme.

In a conventional hot electron injection scheme, a high voltage is applied to the control gate (word line) of a memory cell, and a low or zero voltage is applied to the drain (bit line). When electrons in a channel region disposed between the source and drain regions of the cell attain an energy level higher than the barrier potential of the thin oxide layer disposed between the channel and floating gate, some of the electrons will tunnel through the thin oxide layer and inject into the floating gate. However, not all electrons in the channel region will attain an energy sufficient to tunnel through the thin oxide layer. The probability that an electron will tunnel through the thin oxide layer is proportional to the voltage difference between the control gate and drain region.

In addition, the number of electron charges proportional to the difference between the control gate and drain will appear on the floating gate. These charges impose an electric field on the channel region beneath the floating gate. This electric field is known as the threshold voltage ($V_t$). The threshold voltage determines whether a memory cell is "storing" any data or value. For example, a logic value of "0" may be represented by setting a high threshold voltage and a logic value of "1" may be represented by a low threshold voltage.

FIG. 1A shows a cross sectional view of a conventional one-bit split gate flash memory cell 100. Memory cell 100 includes, a source 105, a drain 110, a floating gate 115 and a control gate 120. Drain 110 may also include a lightly-doped n-region and a heavier-doped n-region to form an N/N+ drain. Drain 110 is connected to a bit line (BL) 125, source 105 is connected to a source line (SL) 130, and control gate 120 is connected to a word line (WL) 135. In general, different threshold voltages of memory cell 100 may be created by providing a fixed voltage to control gate 120 and modulating the voltage provided to drain 110.

Memory cell 100 may be erased with the Fowler-Nordheim tunneling scheme. Under this scheme, a high voltage, for example, 14 volts, may be provided to control gate 120, and 0 (zero) volt may be provided to drain 110 and source 105. Under these conditions, electrons stored in floating gate 115, composed of polysilicon material, tunnel through a dielectric layer 140 to control gate 120, also composed of polysilicon material. Therefore, the Fowler-Nordheim tunneling scheme is also known as "poly-to-poly tunneling" scheme. During read operations, approximately 3 volts may be provided to control gate 120, 2 volts may be provided to drain 110, and source 105 may be grounded. To achieve source-side hot electron injection scheme for programming, a threshold voltage, for example, 1 volt, may be provided to control gate 120, a high voltage, for example, 11 volts, may be provided to drain 110, and source 105 may be grounded.

To determine whether a memory cell has been programmed to the desired value, the conventional flash memory cell may be programmed for a predetermined time period. The value of the memory cell is then verified, and the memory cell may be repeatedly programmed until the desired value has been reached. This is an iterative process. Alternatively, a small voltage may be applied to bit line 125 to verify the potential on the floating gate. This process continues until the potential on the floating gate has reached the desired value. In addition, the conventional split gate flash memory cell only performs a one-bit programming operation, for example, "0" or "1". However, due to an increased demand for a large memory programming capacity together with a rapid data-reading capability, it is desirable that a memory cell accurately store more than one bit.

Figure 1B:
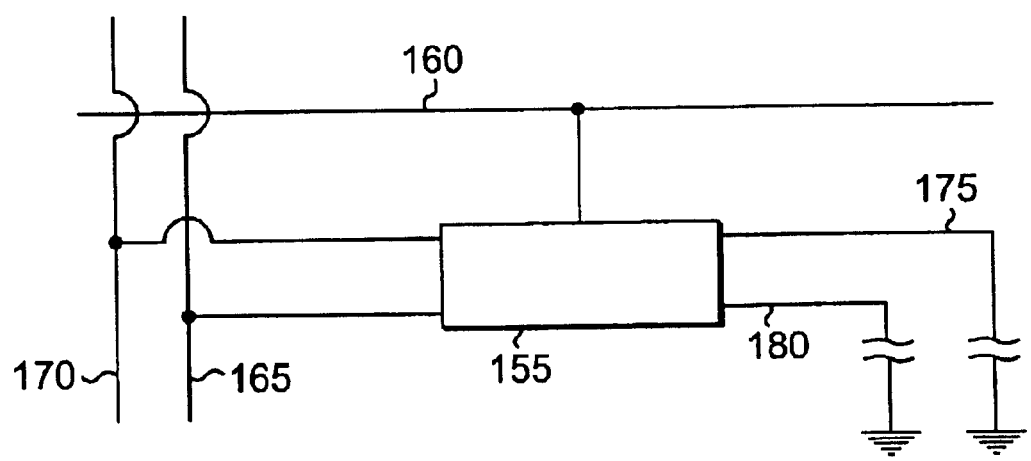
FIG. 1B is a flow chart of an exemplary flash memory cell for sorting two bits per cell consistent with an embodiment of the present invention.

FIG. 1B shows a two-bit flash memory cell 150 capable of storing two bits rather than just one bit of memory cell 100. Memory cell 150 includes a two-bit memory device 155, a word line 160, a first bit line 165 corresponding to a first bit and a first $V_t$, a second bit line 170 corresponding to a second bit and a second $V_t$, a first source line 175 corresponding to the first bit, and a second source line 180 corresponding to the second bit. Memory device 155 may comprise the flash memory device as described in U.S. Pat. No. 6,271,090 incorporated herein by reference, or may comprise many other devices as they are known by those of ordinary skill in the art. In general, in a manner similar to the one bit of memory cell 100, the two bits of memory cell 150 may be programmed by providing a fixed voltage to word line 160 and modulating the voltage provided to either of first bit line 165 or second bit line 170, depending upon which bit is to be programmed. The programming of memory cell 150 will be described in greater detail below.

Consistent with the general principles of the present invention, a system for programming a flash memory cell comprises a component for receiving a first $V_t$ corresponding to a first bit stored in the flash memory cell, a component for receiving a second $V_t$ corresponding to a second bit stored in the flash memory cell, and a component for programming one of the first bit and the second bit of the flash memory cell with a first programming voltage if the first $V_t$ and the second $V_t$ both correspond to a low $V_t$ state prior to programming the flash memory cell wherein the first programming voltage is $\Delta V$ lower than a second programming voltage that is used to program one of the first bit and the second bit of the flash memory cell if either of the first $V_t$ and the second $V_t$ correspond to a high $V_t$ state prior to programming the flash memory cell. In addition, the system for programming a flash memory cell may further comprise a component for determining if the first $V_t$ and the second $V_t$ both corresponding to the low $V_t$ state prior to programming the flash memory cell.

The component for receiving the first $V_t$, the component for receiving the second $V_t$, the component for programming, and the component for determining may comprise elements of, be disposed within, or may otherwise be utilized by or embodied within a mobile phone, a personal computer, a hand-held computing device, a multi-processor system, microprocessor-based or programmable consumer electronic device, a minicomputer, a mainframe computer, a personal digital assistant (PDA), a facsimile machine, a telephone, a pager, a portable computer, or any other device that may receive, transmit, or otherwise utilize information. Those of ordinary skill in the art will recognize that the component for receiving the first $V_t$, the component for receiving the second $V_t$, the component for programming, and the component for determining may comprise elements of, be disposed within, or may otherwise be utilized by or embodied within many other devices or system without departing from the scope and spirit of the invention.

Figure 2:
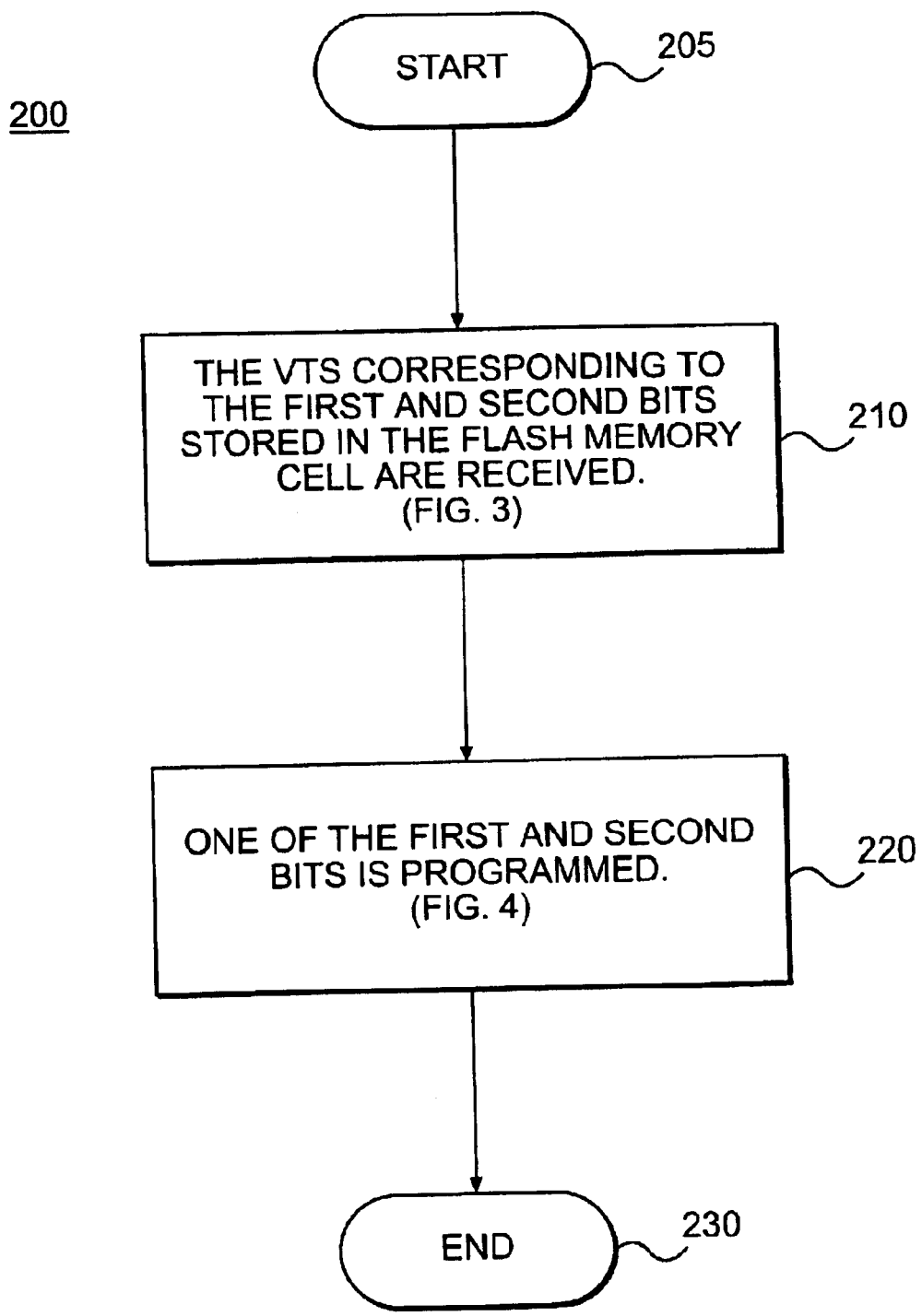
FIG. 2 is a flow chart of an exemplary method for programming a flash memory cell consistent with an embodiment of the present invention.

FIG. 2 is a flow chart setting forth the general stages involved in an exemplary method for programming a flash memory cell consistent with an embodiment of the present invention. The implementation of the stages of exemplary method 200 in accordance with an exemplary embodiment of the present invention will be described in greater detail in FIG. 3 through FIG. 4. Exemplary method 200 begins at starting block 205 and proceeds to exemplary subroutine 210 where the $V_t$s corresponding to the first and second bits stored in the flash memory cell are received. The stages of exemplary subroutine 210 are shown in FIG. 3 and will be described in greater detail below.

Figure 4:
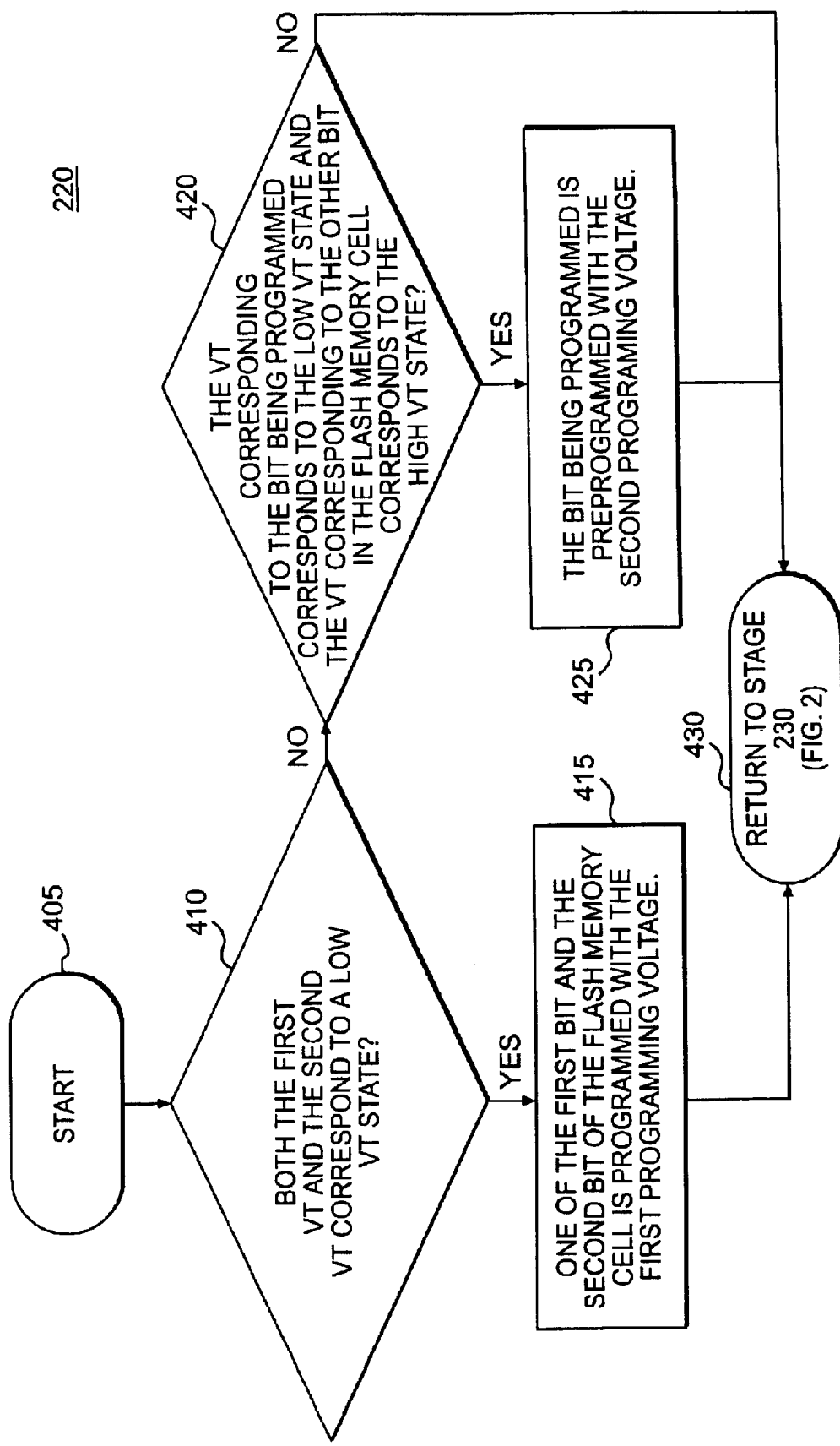
FIG. 4 is a flow chart of an exemplary subroutine used in the exemplary method of FIG. 2 for programming one of the first and second bits consistent with an embodiment of the present invention.
Figure 5:
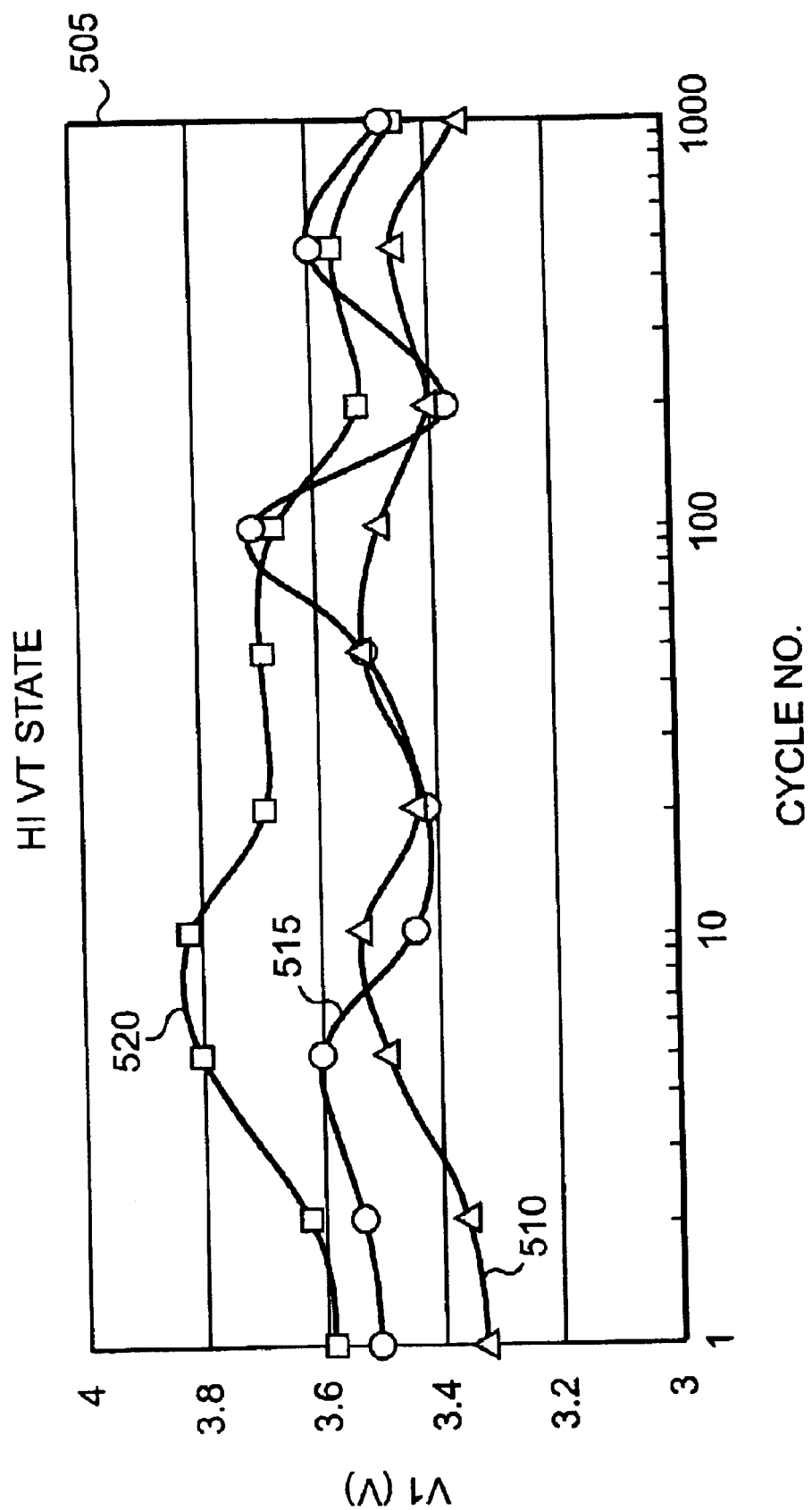
FIG. 5 is a diagram illustrating effects of prior art programming techniques.
Figure 6A:
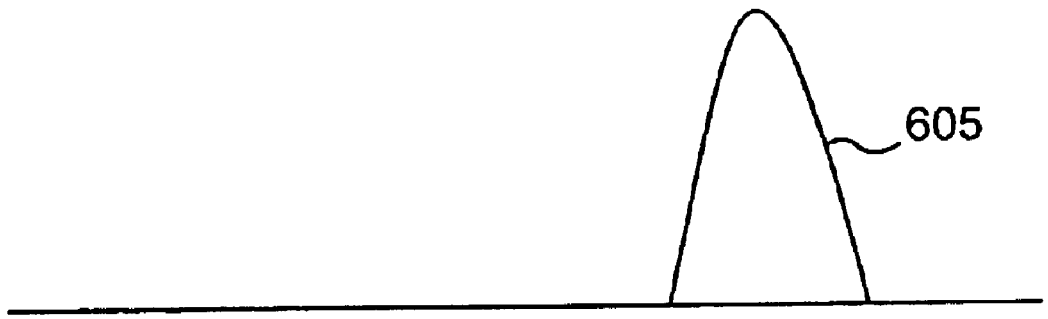
FIG. 6 is a diagram illustrating the probabilistic distributions of the effects of prior art programming techniques.
Figure 6B:
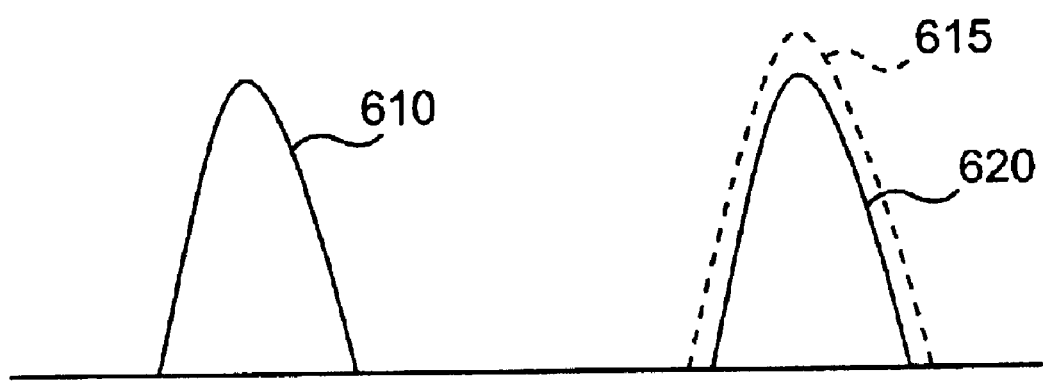

From exemplary subroutine 210 where the $V_t$s corresponding to the first and second bits stored in the flash memory cell are received, exemplary method 200 continues to exemplary subroutine 220 where one of the first and second bits is programmed. The stages of exemplary subroutine 220 are shown in FIG. 4 and will be described in greater detail below. Once one of the first and second bits is programmed in exemplary subroutine 220, exemplary method 200 ends at stage 230.

Figure 3:
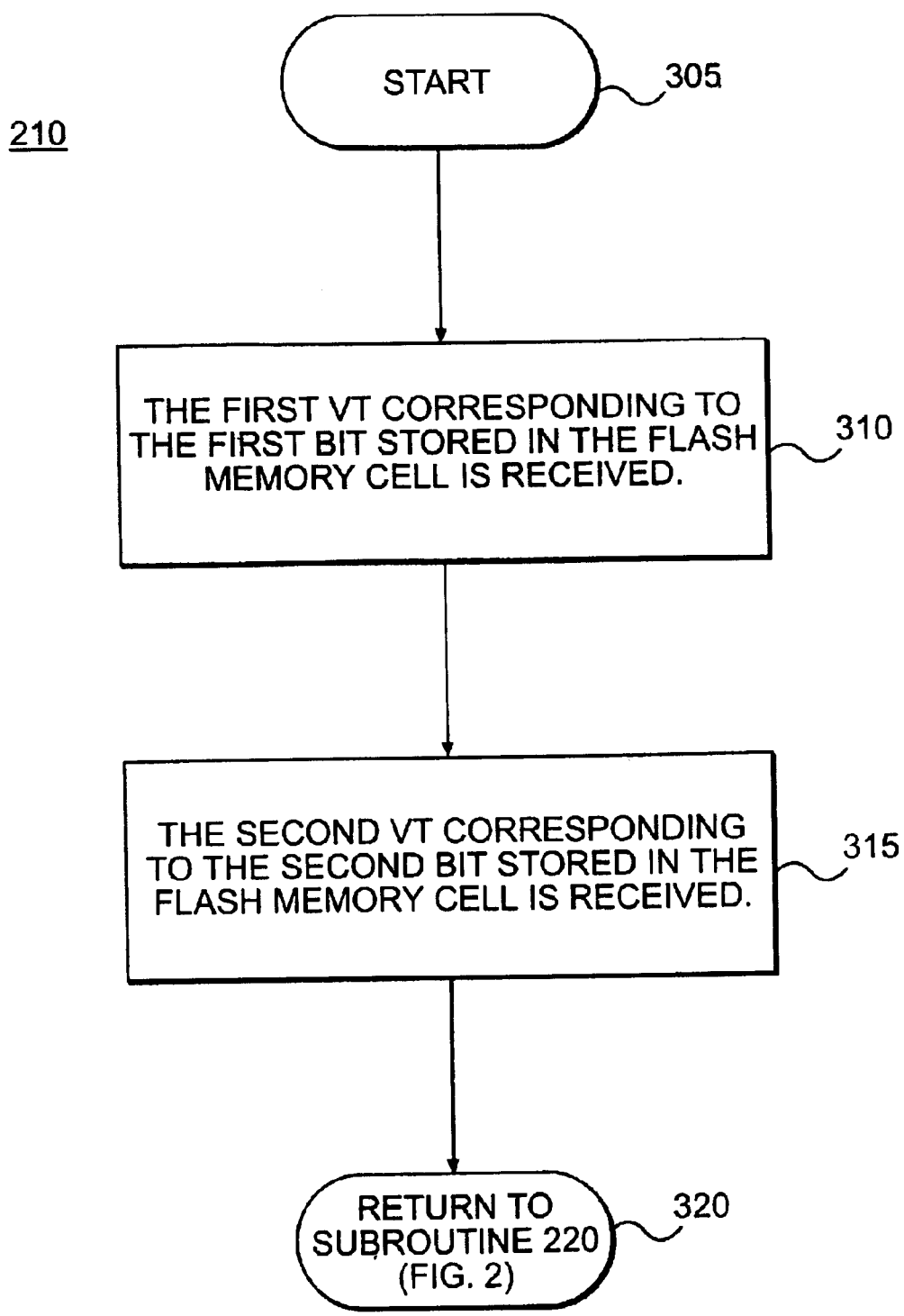
FIG. 3 is a flow chart of an exemplary subroutine used in the exemplary method of FIG. 2 for receiving the $V_t$s corresponding to the first and second bits stored in the flash memory cell consistent with an embodiment of the present invention.

FIG. 3 describes exemplary subroutine 210 from FIG. 2 for receiving the $V_t$s corresponding to the first and second bits stored in the flash memory cell. Exemplary subroutine 210 begins at starting block 305 and advances to stage 310 where the first $V_t$ corresponding to the first bit stored in the flash memory cell is received. For example, the component for receiving the first $V_t$ may sample first bit line 165 and detect the voltage on first bit line 165. The first $V_t$ is set equal to the voltage detected on first bit line 165. Specifically, if the first $V_t$ falls between 1.5V and 2.8V, it may be considered to be in a low $V_t$ state and represent a digital 1. In addition, if the first $V_t$ falls between 3.3V and 3.85V, it may be considered to be in a high $V_t$ state and represent a digital 0.

After the first $V_t$ corresponding to the first bit stored in the flash memory cell is received in stage 310, exemplary subroutine 210 continues to stage 315 where the second $V_t$ corresponding to the second bit stored in the flash memory cell is received. For example, the component for receiving the second $V_t$ may sample second bit line 170 and detect the voltage on second bit line 170. The second $V_t$ is set equal to the voltage detected on second bit line 170. Specifically, if the second $V_t$ falls between 1.5V and 2.4V, it may be considered to be in a low $V_t$ state and represent a digital 1. In addition, if the second $V_t$ falls between 3.3V and 3.85V, it may be considered to be in a high $V_t$ state and represent a digital 0.

Once the second $V_t$ corresponding to the second bit stored in the flash memory cell is received in stage 315, exemplary subroutine 210 continues to stage 320 and returns to subroutine 220 of FIG. 2.

FIG. 4 describes exemplary subroutine 220 from FIG. 2 for programming one of the first bit and the second bit of the flash memory cell. Exemplary subroutine 220 begins at starting block 405 and advances to decision block 410 where it is determined if both the first $V_t$ and the second $V_t$ correspond to the low $V_t$ state. For example, if both the first $V_t$ and the second $V_t$ fall between 1.5V and 2.4V, they may both be considered to be in the low $V_t$ state.

If both the first $V_t$ and the second $V_t$ correspond to the low $V_t$ state in decision block 410, exemplary subroutine 220 continues to stage 415 where one of the first bit and the second bit of the flash memory cell is programmed with the first programming voltage. For example, one of the first bit and the second bit of memory cell 150 may be programmed by providing a fixed voltage to word line 160 and modulating the voltage provided to either of first bit line 165 or second bit line 170, depending upon which bit is to be programmed. In order to program the bit with the first programming voltage, the voltage difference between the voltage on word line 160 and the bit line corresponding to the bit being programmed is set approximately equal to the desired first programming voltage.

Specifically, the first programming voltage may be $\Delta V$ lower than a second programming voltage that is used to program one of the first bit and the second bit of the flash memory cell if either of the first $V_t$ and the second $V_t$ correspond to a high $V_t$ state prior to programming the flash memory cell. $\Delta V$ may be inclusively between 0.2V and 0.3V or may be greater than 0.3V. Notwithstanding, the first programming voltage and the second programming voltage may correspond to a high $V_t$ state.

If both the first $V_t$ and the second $V_t$ do not correspond to the low $V_t$ state in decision block 410, however, exemplary subroutine 220 continues to decision block 420 where it is determined if the $V_t$ corresponding to the bit being programmed corresponds to the low $V_t$ state and the $V_t$ corresponding to the other bit in the flash memory cell corresponds to the high $V_t$ state. For example, if the $V_t$ of the bit being programmed falls between 1.5V and 2.4V, then it may be considered to be in a low $V_t$ state. And if the $V_t$ of the bit not being programmed falls between 3.3V and 3.85V, then it may be considered to be in a high $V_t$ state.

At decision block 420, if it is determined that the $V_t$ corresponding to the bit being programmed correspond to the low $V_t$ state and the $V_t$ corresponding to the other bit in the flash memory cell corresponds to the high $V_t$ state, exemplary subroutine 220 continues to stage 425 where the bit being programmed in the flash memory cell is programmed with the second programming voltage. For example the bit being programmed in memory cell 150 may be programmed by providing a fixed voltage to word line 160 and modulating the voltage provided to either of first bit line 165 or second bit line 170, depending upon which bit is to be programmed. In order to program the bit with the second programming voltage, the voltage difference between the voltage on word line 160 and the bit line corresponding to the bit being programmed is set approximately equal to the desired second programming voltage.

Specifically, the second programming voltage may be $\Delta V$ higher than the first programming voltage that was used to program the other bit of the flash memory cell if the $V_t$ of the other bit corresponds to the high $V_t$ state prior to programming the flash memory cell. $\Delta V$ may be inclusively between 0.2V and 0.3V or may be greater than 0.3V. Notwithstanding, the first programming voltage and the second programming voltage may correspond to the high $V_t$ state.

After one of the first bit and the second bit of the flash memory cell is programmed with the first programming voltage in stage 415, from stage 425 where the bit being programmed in the flash memory cell is programmed with the second programming voltage, or if at decision block 420 it was determined that the $V_t$ corresponding to the bit being programmed does not correspond to the low $V_t$ state and that the $V_t$ corresponding to the other bit in the flash memory cell does not correspond to the high $V_t$ state, exemplary subroutine 220 continues to stage 430 and returns to stage 230 of FIG. 2.

Consistent with an embodiment of the invention, method 200, as described above, may be repeated for a plurality of flash memory cells comprising a memory array. Specifically, for all cells of the memory array in which the first $V_t$ and the second $V_t$ both correspond to the high $V_t$ state after programming the memory array is complete, a statistical distribution of the $V_t$ values corresponding to first bits programmed in time is narrower and of a lower magnitude than a statistical distribution of the $V_t$ values corresponding to first bit programmed in time if the $\Delta V$ is zero. Therefore, when embodiments of the present invention utilize a first programming voltage for the first bit of a memory cell programmed in time that is, for example, about 0.2V to 0.3V lower than a second programming voltage, a $V_t$ level of the first bit may be obtained that is substantially equal to the $V_t$ level of the second bit after the second bit is programmed.

It will be appreciated that a system in accordance with an embodiment of the invention can be constructed in whole or in part from special purpose hardware or a general purpose computer system, or any combination thereof. Any portion of such a system may be controlled by a suitable program. Any program may in whole or in part comprise part of or be stored on the system in a conventional manner, or it may in whole or in part be provided in to the system over a network or other mechanism for transferring information in a conventional manner. In addition, it will be appreciated that the system may be operated and/or otherwise controlled by means of information provided by an operator using operator input elements (not shown) which may be connected directly to the system or which may transfer the information to the system over a network or other mechanism for transferring information in a conventional manner.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for programming a flash memory cell, comprising:
    receiving a first $V_t$ corresponding to a first bit stored in the flash memory cell;
    receiving a second $V_t$ corresponding to a second bit stored in the flash memory cell; and
    programming one of the first bit and the second bit of the flash memory cell with a first programming voltage if the first $V_t$ and the second $V_t$ both correspond to a low $V_t$ state prior to programming the flash memory cell wherein the first programming voltage is $\Delta V$ lower than a second programming voltage that is used to program one of the first bit and the second bit of the flash memory cell if either of the first $V_t$ and the second $V_t$ correspond to a high $V_t$ state prior to programming the flash memory cell.

2. The method of claim 1, further comprising programming one of the first bit and the second bit of the flash memory cell with the second programming voltage if, prior to programming the flash memory cell, the $V_t$ corresponding to the bit being programmed corresponds to the low $V_t$ state and the $V_t$ corresponding to the other bit in the flash memory cell corresponds to the high $V_t$ state.

3. The method of claim 2, wherein after the method is repeated for a plurality of flash memory cells and wherein for all cells of the plurality of flash memory cells in which the first $V_t$ and the second $V_t$ both correspond to the high $V_t$ state after programming, a statistical distribution of the $V_t$ values corresponding to the ones of the first bits and second bits programmed first in time per cell is narrower and of a lower magnitude than a statistical distribution of the $V_t$ values corresponding to the ones of the first bits and second bits programmed first in time per cell if the $\Delta V$ is zero.

4. The method of claim 1, further comprising determining if the first $V_t$ and the second $V_t$ both corresponding to the low $V_t$ state prior to programming the flash memory cell.

5. The method of claim 1, wherein the first programming voltage and the second programming voltage corresponding to a high $V_t$ state.

6. The method of claim 1, wherein the high $V_t$ state represents a digital 0.

7. The method of claim 1, wherein the low $V_t$ state represents a digital 1.

8. The method of claim 1, wherein the $\Delta V$ is inclusively between 0.2V and 0.3V.

9. The method of claim 1, wherein the ΔV is greater than 0.3V.

10. A system for programming a flash memory cell, comprising:

a component for receiving a first $V_t$ corresponding to a first bit stored in the flash memory cell;

a component for receiving a second $V_t$ corresponding to a second bit stored in the flash memory cell; and a component for programming one of the first bit and the second bit of the flash memory cell with a first programming voltage if the first $V_t$ and the second $V_t$ both correspond to a low $V_t$ state prior to programming the flash memory cell wherein the first programming voltage is ΔV lower than a second programming voltage that is used to program one of the first bit and the second bit of the flash memory cell if either of the first $V_t$ and the second $V_t$ correspond to a high $V_t$ state prior to programming the flash memory cell.

11. The system of claim 10, wherein the component for programming is further configured for programming one of the first bit and the second bit of the flash memory cell with the second programming voltage if, prior to programming the flash memory cell, the $V_t$ corresponding to the bit being programmed corresponds to the low $V_t$ state and the $V_t$ corresponding to the other bit in the flash memory cell corresponds to the high $V_t$ state.

12. The system of claim 11, further comprising a component for determining if the first $V_t$ and the second $V_t$ both corresponding to the low $V_t$ state prior to programming the flash memory cell.

13. The system of claim 11, wherein the first programming voltage and the second programming voltage corresponding to a high $V_t$ state.

14. The system of claim 11, wherein the high $V_t$ state represents a digital 0.

15. The system of claim 11, wherein the low $V_t$ state represents a digital 1.

16. The system of claim 11, wherein the ΔV is inclusively between 0.2V and 0.3V.

17. The system of claim 11, wherein the ΔV is greater than 0.3V.

18. A computer-readable medium on which is stored a set of instructions for programming a flash memory cell, which when executed perform stages comprising:

receiving a first $V_t$ corresponding to a first bit stored in the flash memory cell;

receiving a second $V_t$ corresponding to a second bit stored in the flash memory cell; and programming one of the first bit and the second bit of the flash memory cell with a first programming voltage if the first $V_t$ and the second $V_t$ both correspond to a low $V_t$ state prior to programming the flash memory cell wherein the first programming voltage is ΔV lower than a second programming voltage that is used to program one of the first bit and the second bit of the flash memory cell if either of the first $V_t$ and the second $V_t$ correspond to a high $V_t$ state prior to programming the flash memory cell.

19. The computer-readable medium of claim 18, further comprising programming one of the first bit and the second bit of the flash memory cell with the second programming voltage if, prior to programming the flash memory cell, the $V_t$ corresponding to the bit being programmed corresponds to the low $V_t$ state and the $V_t$ corresponding to the other bit in the flash memory cell corresponds to the high $V_t$ state.

20. The computer-readable medium of claim 19, wherein after the stages are repeated for a plurality of flash memory cells and wherein for all cells of the plurality of flash memory cells in which the first $V_t$ and the second $V_t$ both correspond to the high $V_t$ state after programming, a statistical distribution of the $V_t$ values corresponding to the ones of the first bits and second bits programmed first in time per cell is narrower and of a lower magnitude than a statistical distribution of the $V_t$ values corresponding to the ones of the first bits and second bits programmed first in time per cell if the ΔV is zero.

21. The computer-readable medium of claim 18, further comprising determining if the first $V_t$ and the second $V_t$ both corresponding to the low $V_t$ state prior to programming the flash memory cell.

22. The computer-readable medium of claim 18, wherein the first programming voltage and the second programming voltage corresponding to a high $V_t$ state.

23. The computer-readable medium of claim 18, wherein the high $V_t$ state represents a digital 0.

24. The computer-readable medium of claim 18, wherein the low $V_t$ state represents a digital 1.

25. The computer-readable medium of claim 18, wherein the ΔV is inclusively between 0.2V and 0.3V.

26. The computer-readable medium of claim 18, wherein the ΔV is greater than 0.3V.

* * * * *